(12) United States Patent
Tsui et al.

(10) Patent No.: US 7,838,339 B2
(45) Date of Patent: Nov. 23, 2010

(54) SEMICONDUCTOR DEVICE PACKAGE HAVING FEATURES FORMED BY STAMPING

(75) Inventors: Anthony C. Tsui, Saratoga, CA (US); Mohammad Eslamy, Palo Alto, CA (US); Anthony Chia, Singapore (SG); Hongbo Yang, Shanghai (CN); Ming Zhou, Shanghai (CN); Jian Xu, Shanghai (CN)

(73) Assignee: GEM Services, Inc., Santa Clara, CA (US)

( * ) Notice: Subject to any disclaimer, the term of this patent is extended or adjusted under 35 U.S.C. 154(b) by 0 days.

(21) Appl. No.: 12/191,527

(22) Filed: Aug. 14, 2008

(65) Prior Publication Data

US 2009/0250796 A1    Oct. 8, 2009

Related U.S. Application Data

(60) Provisional application No. 61/042,602, filed on Apr. 4, 2008.

(51) Int. Cl.
*H01L 21/82* (2006.01)

(52) U.S. Cl. .................. 438/123; 438/121; 438/125; 438/127; 29/829; 257/666; 257/669; 257/676; 257/674; 257/678; 257/690; 257/692; 257/696; 257/734; 257/735; 257/773; 257/775; 257/784; 257/787; 257/E23.031; 257/E21.499

(58) Field of Classification Search .......... 257/E23.037, 257/E21.502, 666–798, E23.031, E21.499; 438/123, 121, 125, 127; 29/827
See application file for complete search history.

(56) References Cited

U.S. PATENT DOCUMENTS

| | | | | |
|---|---|---|---|---|
| 6,924,549 | B2 * | 8/2005 | Nose et al. | 257/676 |
| 7,122,406 | B1 * | 10/2006 | Yilmaz et al. | 438/123 |
| 2002/0038908 | A1 * | 4/2002 | Ding et al. | 257/720 |
| 2003/0134490 | A1 * | 7/2003 | Inuzuka | 438/459 |
| 2007/0001276 | A1 * | 1/2007 | Kishimoto | 257/668 |
| 2007/0052070 | A1 * | 3/2007 | Islam et al. | 257/666 |
| 2008/0111219 | A1 * | 5/2008 | Harnden et al. | 257/676 |
| 2008/0122048 | A1 * | 5/2008 | Chan et al. | 257/666 |

FOREIGN PATENT DOCUMENTS

JP        62030358 A  *  2/1987

* cited by examiner

*Primary Examiner*—Fernando L Toledo
*Assistant Examiner*—John P Dulka
(74) *Attorney, Agent, or Firm*—Townsend and Townsend and Crew, LLP

(57) ABSTRACT

Embodiments of the present invention relate to the use of stamping to form features on a lead frame of a semiconductor device package. In one embodiment, portions of the lead frame such as pins are moved out of the horizontal plane of a diepad by stamping. In certain embodiments, indentations or a complex cross-sectional profile, such as chamfered, may be imparted to portions of the pins and/or diepad by stamping. The complexity offered by such a stamped cross-sectional profile serves to enhance mechanical interlocking of the lead frame within the plastic molding of the package body. Other techniques such as selective electroplating and/or formation of a brown oxide guard band to limit spreading of adhesive material during die attach, may be employed alone or in combination to facilitate fabrication of a package having such stamped features.

19 Claims, 17 Drawing Sheets

SEMICONDUCTOR DEVICE PACKAGE HAVING FEATURES FORMED BY STAMPING

CROSS-REFERENCE TO RELATED APPLICATION

The instant nonprovisional patent application claims priority to U.S. Provisional Patent Application No. 61/042,602 filed Apr. 4, 2008 and incorporated by reference in its entirety herein for all purposes.

BACKGROUND OF THE INVENTION

FIGS. 1A-1H show simplified cross-sectional views of a conventional process for fabricating a package for a semiconductor device. The views of FIGS. 1A-H are simplified in that the relative proportions of the various components are not shown to scale.

In FIG. 1A, a planar, continuous rolls 102 of conducting material such as copper, is provided.

In FIG. 1B, material is removed from regions of the planar roll 102 utilizing a chemical etching process. This chemical etching process involves forming a mask, and then etching in regions exposed by the mask, followed by removal of the mask. This chemical etching serves to define a central diepad 104 surrounded by a metal matrix 106. Although not shown in the particular cross-sectional view in FIG. 1B, portions of the diepad 104 may remain integral with the metal matrix 106.

FIG. 1C shows partial etching of the backside of portions of the patterned roll 102. Etched regions 104a of the periphery of the diepad 104 will later serve to allow the diepad to be physically secured within the plastic molding of the package body. Etched regions 108a correspond to portions of pins of the lead frame. These etched regions 108a will later serve to allow the pins to be physically secured within the plastic molding of the package body. FIG. 1C marks the step of completion of formation of lead frame 103.

FIG. 1D shows the formation of an electrically conducting adhesive material 110 on the die attach region 104b of the diepad 104. This electrically conducting adhesive material may comprise soft solder deposited in molten form. Alternatively, the electrically conducting adhesive material may comprise solder paste that is deposited in the form of small-sized particles of solder in a binder such as a solvent.

FIG. 1E shows the die-attach step, wherein the back side 112a of semiconductor die 112 is placed against electrically conducting adhesive material 110. As shown in FIG. 1E, one consequence of this die attach step may be the spreading of material 110 on the diepad 104 beyond the perimeter of the die 112.

FIG. 1F shows a subsequent step, wherein bond wires 114 are attached between contacts on the top surface 112b of the die 112 and pins 108.

FIG. 1G shows a further subsequent step, wherein the diepad 104, die 112, bond wires 114, and portions of the pins 108 are encapsulated with a plastic molding material 116 to define a body 118 of the package. As previously indicated, the recesses 104a and 108a serve to physically secure the diepad and pins, respectively, within the package during this encapsulation step.

FIG. 1H shows a subsequent singulation step, wherein the package 120 is separated from the surrounding metal frame by a sawing process.

While the conventional process flow just described is adequate to form a semiconductor device package, it may offer certain drawbacks. In particular, the partial etching step shown in FIG. 1C may be difficult to achieve, and hence adds to the cost of manufacturing the device. In particular, this partial etching step involves a number of steps, including the highly accurate patterning of a mask, followed by only partial etching in exposed areas and then removal of the mask. In particular, the partial etching of the metal roll may be difficult to halt with sufficient accuracy and repeatability.

Accordingly, there is a need in the art for a process for forming a semiconductor device package which avoids the need for a partial etching step.

BRIEF SUMMARY OF THE INVENTION

Embodiments of the present invention relate to the use of stamping to form features on a lead frame of a semiconductor device package. In one embodiment, portions of the lead frame such as pins are moved out of the horizontal plane of a diepad by stamping. In certain embodiments, a complex cross-sectional profile, such as chamfered, may be imparted to portions of the pins and/or diepad by stamping. The complexity offered by such a stamped cross-sectional profile serves to enhance mechanical interlocking of the lead frame within the plastic molding of the package body. Other techniques such as selective electroplating and/or formation of a brown oxide guard band to limit spreading of adhesive material during die attach, may be employed alone or in combination to facilitate fabrication of a package having such stamped features.

These and other embodiments of the present invention, as well as its features and some potential advantages are described in more detail in conjunction with the text below and attached figures.

BRIEF DESCRIPTION OF THE DRAWINGS

FIGS. 2CA-2CC show end views of various complex cross-sectional profiles that may be imparted by stamping according to embodiments of the present invention.

DETAILED DESCRIPTION OF THE INVENTION

Embodiments of the present invention relate to the formation of semiconductor device packages utilizing stamping. In one embodiment, portions of the lead frame such as pins are moved out of the horizontal plane of a diepad by stamping. In certain embodiments, the pins of a package may be imbued with a chamfered or other complex cross-sectional profile by a stamping process. Other techniques, employed alone or in combination, may facilitate fabrication of a package by stamping.

FIGS. 2A-2K show simplified cross-sectional views of a process in accordance with an embodiment of the present invention for forming a semiconductor device package. The views of FIGS. 2A-2K are simplified in that the relative proportions of the components of the package are not shown to scale.

Figure 2A:
FIGS. 2A-2K show simplified cross-sectional views of an embodiment of a process in accordance with the present invention for forming a package.

In FIG. 2A, a planar, continuous roll 202 of conducting material such as copper, is provided. In particular embodiments, the metal roll may have a thickness of between about 4-20 mils (0.004"-0.020"). In certain embodiments, the metal roll has a thickness of between about 6-10 mils (0.006"-0.010").

Figure 2B:
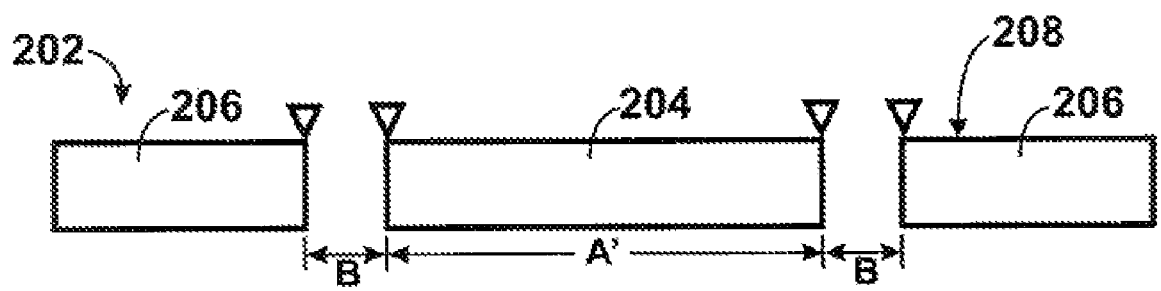

In FIG. 2B, material is removed from the planar roll 202 utilizing a punching process, with points of removal of material indicated by the triangles. This punching process serves to define a central diepad 204 surrounded by a metal matrix 206. Although not shown in the particular cross-sectional view in FIG. 2B, portions of the diepad 204 may remain integral with the surrounding metal matrix 206.

Also defined during the punching step of FIG. 2B are a plurality of pins 208 integral with the surrounding metal matrix. According to certain embodiments, the minimum width of these pins is about 0.15 mm, and the minimum pitch between the pins is about 0.4 mm, where the pitch is defined as the distance between the center lines of adjacent pins. In particular embodiments where the thickness of the metal roll is between about 6-10 mils, the width of these pins is about 0.25 mm and the pitch between the pins is about 0.5 mm.

Figure 1A:
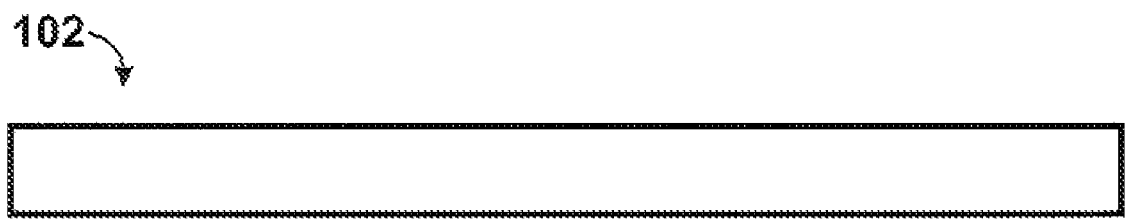
FIGS. 1A-H show simplified cross-sectional views of a conventional process for fabricating a package.
Figure 1B:
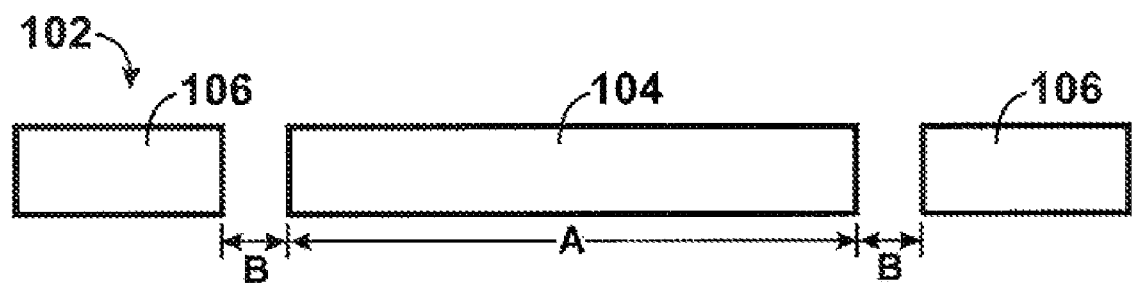
Figure 1C:
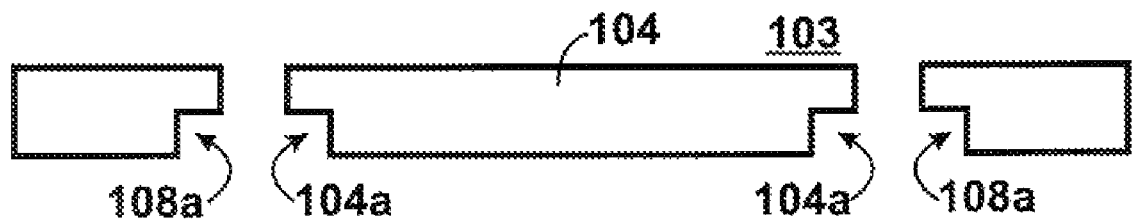

FIG. 2B shows that the lateral dimension (A') of the diepad 204, may be slightly smaller than the corresponding lateral dimension (A) of the diepad 104 formed by the conventional process shown in FIG. 1B. As discussed in detail below, this smaller diepad size may be a result of fabrication of the package utilizing stamping techniques.

Figure 2C:
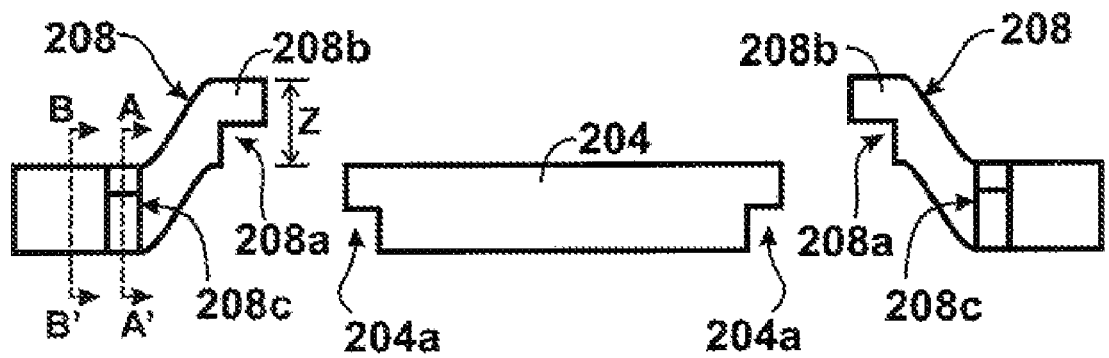

Specifically, FIG. 2C shows the use of stamping to impart several features to the lead frame. One feature formed by stamping is an indentation at the edge of the diepad and/or pins. Specifically, FIG. 2C shows indentation 204a around the periphery of the underside of diepad 204. FIG. 2C also shows indentation 208a at the edge of the pin. proximate to the diepad. By receiving the plastic molding of the package body during the subsequent encapsulation step, stamped indentations 204a and 208a serve to enhance mechanical interlocking between the body of the package and the diepad and pins respectively.

Another lead frame feature shown in FIG. 2C formed by stamping, is elevation of a portion 208b of pins 208 above a horizontal plane of the diepad 204. This raising of portions 208b of the pins 208 closest to the diepad 204, causes the pins to penetrate deeper into the body of the package, helping to physically secure the pins within the encapsulating plastic mold of the package body. Raising of the pin portions also relieves stress in the bond structure, by making the ends of the bond structure located at approximately the same height.

According to certain embodiments, the stamping process may raise the pin portions 208a to a height Z above the surface of the diepad 204, where Z corresponds approximately to an expected thickness of a die supported on the diepad, and a conducting adhesive material between the die and the diepad.

Still another feature which may be imparted to a lead frame during the stamping of FIG. 2C, is a complex cross-sectional profile to a middle portion 208c of the pin 208. Specifically, FIG. 2CA shows a view of middle portion 208b of the pin 208, taken along section A-A' of FIG. 2C. FIG. 2CB shows a view of a portion of the pin 208 taken along section B-B of FIG. 2C.

In the particular embodiment of FIGS. 2CA-CB, the middle pin portion 208b exhibits a chamfered profile, with sides positioned at an angle relative to the vertical disposition of the sides of the other portions of the pin. In this embodiment, the complex cross-sectional profiles imparted to the lead frame by stamping according to embodiments of the present invention, enhances mechanical interlocking of the pins within the plastic body of the package. In addition, the stamped cross-sections allow the pins to offer a larger surface area to the surrounding molding material, thereby further enhancing mechanical interlocking between lead frame and package body. Moreover, the complex stamped cross-sectional profiles may allow the pins to better relieve physical stress during the subsequent singulation step, thus avoiding damage at the interface between the pin and the plastic package body.

While FIG. 2CA shows the complex cross-sectional profile as being a chamfer, this is not required by the present invention. In other embodiments, the cross-sectional profile imparted by stamping could be hour-glass shaped, T-shaped, H-shaped, angled or curved concave or convex, or saw tooth shaped, as shown in FIG. 2CC.

The various features formed by stamping in FIG. 2C need not be created in a single stamping step. One or more separate stamping impacts under different conditions could be employed to create the stamped features.

Figure 2D:
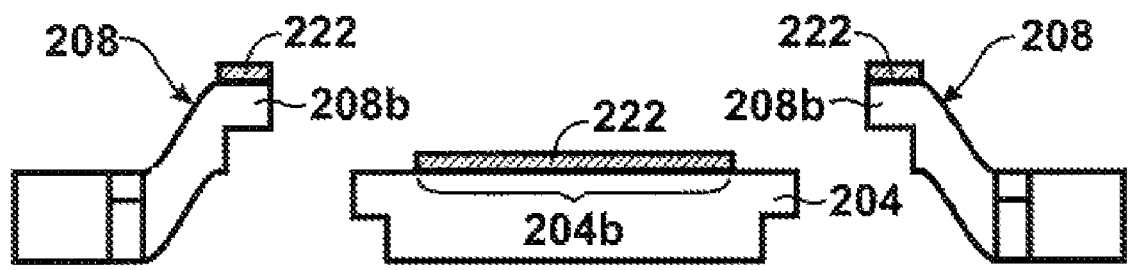

FIG. 2D shows a simplified view of a post-stamping electroplating process according to an embodiment of the present invention. Specifically, electroplated material 222 is selectively formed on certain regions of the lead frame.

Specifically, electroplated material 222 may be formed on the die attach portion 204b of the diepad 204 that is expected to receive the die. Where the die to be supported by the diepad has an electrical contact on its lower surface (such as the drain of a MOSFET), the electroplated material 222 will likely contain silver (Ag).

Another location of electroplated material is at an end of the elevated portion 208a of the pin 208 proximate to the diepad 204. As discussed in detail below, these electroplated regions are expected to receive the electrically conducting bond wire, bond ribbon, or bond clip from the top surface of the supported die.

The composition of the electroplated material 222 may be dictated by the composition of the bond wire/ribbon/clip with which the electroplated material will be in contact. The following TABLE provides a listing of electroplated materials under different conditions.

TABLE

| Bonding | Material | Finished Lead Surface for Bonding |
|---------|----------|-----------------------------------|
| Wire    | Gold Wire | Ni, Ag, Ni/Au, or Ni/Pd/Au |
|         | Al-Wire   | Bare Cu, Ni, Ag, Ni/Au, or Ni/Pd/Au |
|         | Cu-wire   | Bare Cu, Ni, Ni/Au, or Ni/Pd/Au |
| Ribbon  | Al        | Bare Cu, Ni, Ag, Ni/Au, or Ni/Pd/Au |
|         | Cu-       | Bare Cu, Ni, Ni/Au, or Ni/Pd/Au |
| Clip    | Cu        | Bare Cu, Ni, Ni/Au, or Ni/Pd/Au |

Figure 2E:
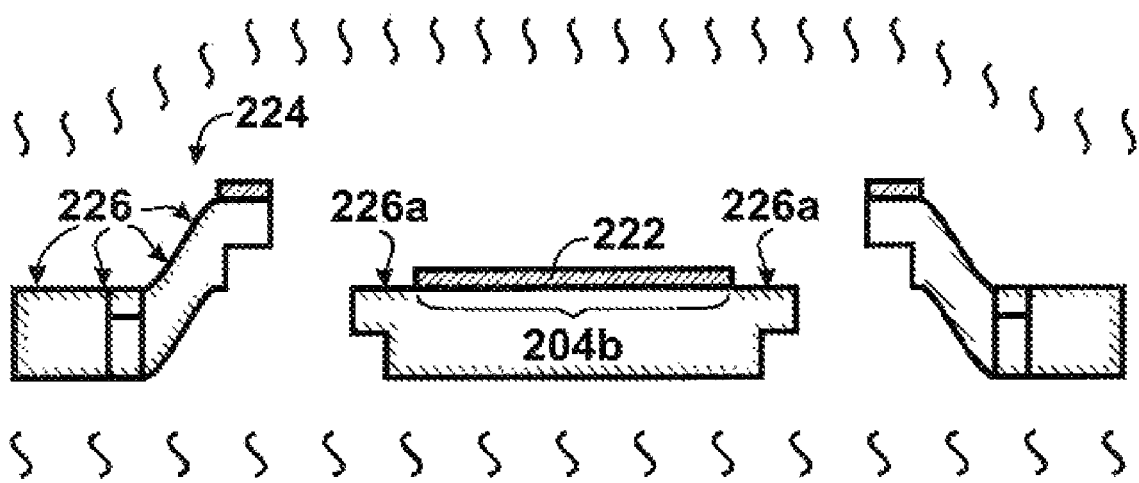

FIG. 2E shows a next step in the process, wherein the electroplated lead frame is exposed to an oxidizing ambient 224. As a result of this exposure, portions of the lead frame that have not been electroplated, become oxidized and form "brown oxide" 226. As discussed below, this brown oxide 226 may exhibit properties that are useful in subsequent steps in the package. In particular, formation of a brown oxide guard band 226a circumscribing the die attach area 204b, may be useful.

Figure 1D:
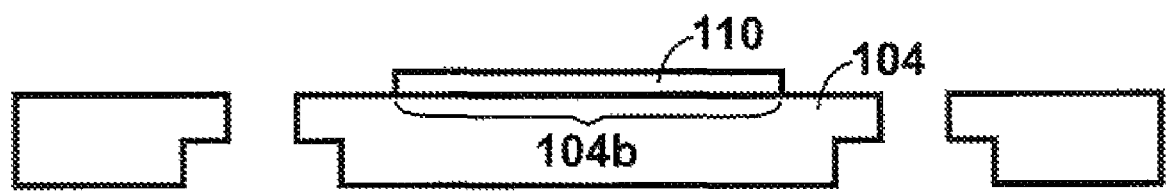
Figure 1E:
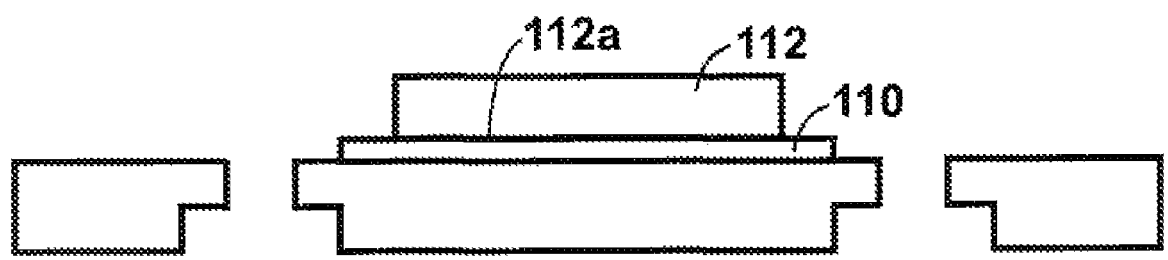
Figure 1F:
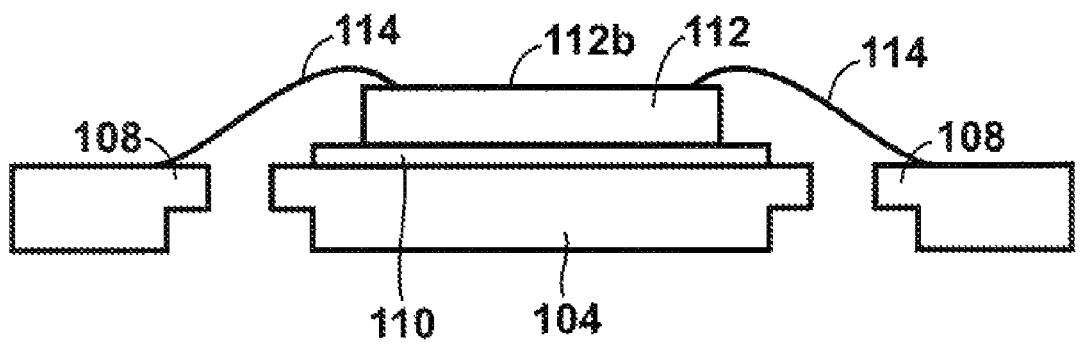
Figure 1G:
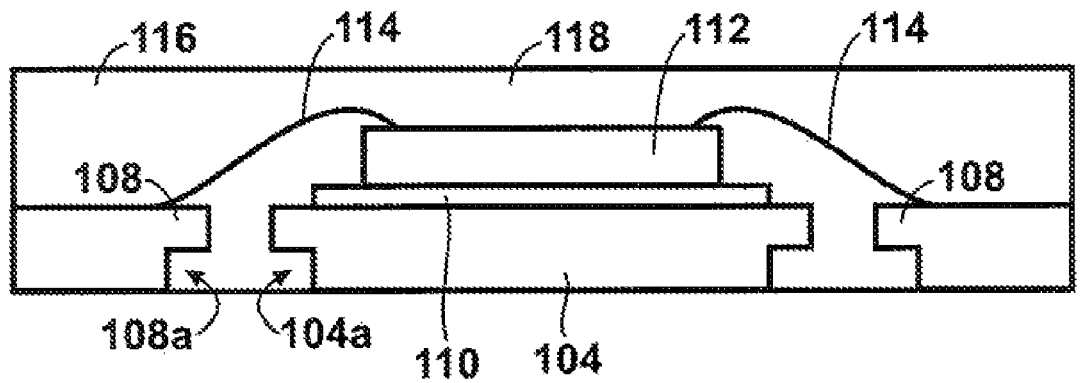
Figure 1H:
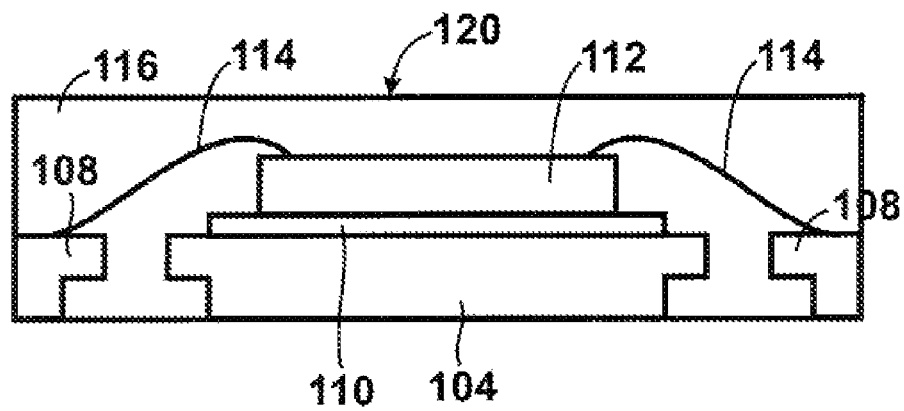
Figure 2F:
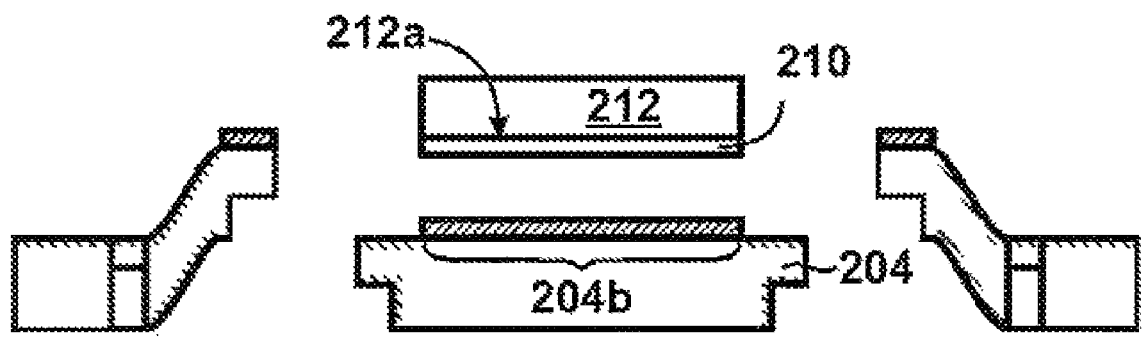

FIG. 2F shows the next step, wherein die 212 is provided having its lower surface 212a already coated with an electrically conducting adhesive material 210 such as soft solder. This step obviates the need for the selective deposition of the electrically conducting adhesive material on the die attach area that is shown in FIG. 1D of the convention process.

Figure 2G:
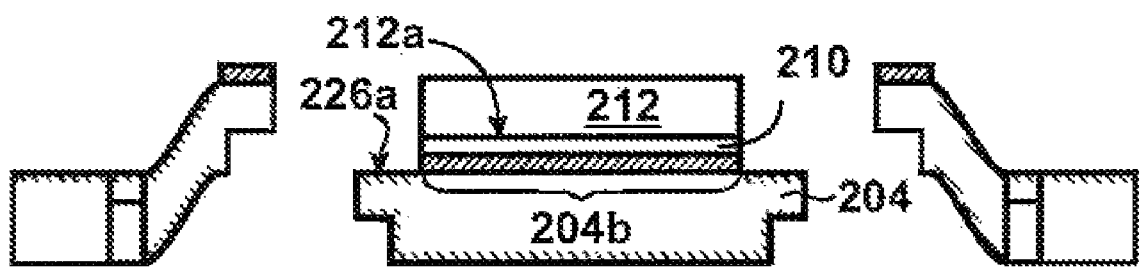
Figure 2H:
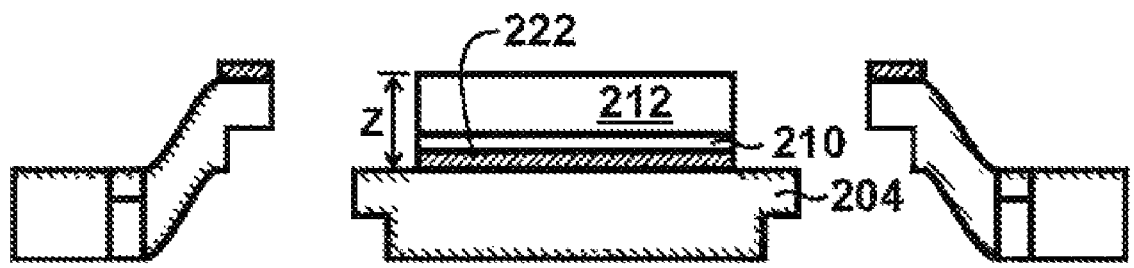

FIG. 2G shows the next step, wherein die 212 bearing electrically conducting adhesive material 210, is placed against die attach area 204b of diepad 204. In this step, the presence of the brown oxide guard band 226a secures to restrain the flow of the soft solder material beyond the confines of the die attach area. Specifically, the roughness and non-wetting properties of the brown oxide inhibit the spreading of the soft solder. The thickness of the die 212 supported on the diepad 204 and a conducting adhesive material 210 between the die and the diepad corresponds approximately to a height Z above the surface of the diepad 206a, as shown in FIG. 2H and discussed above.

Figure 2I:
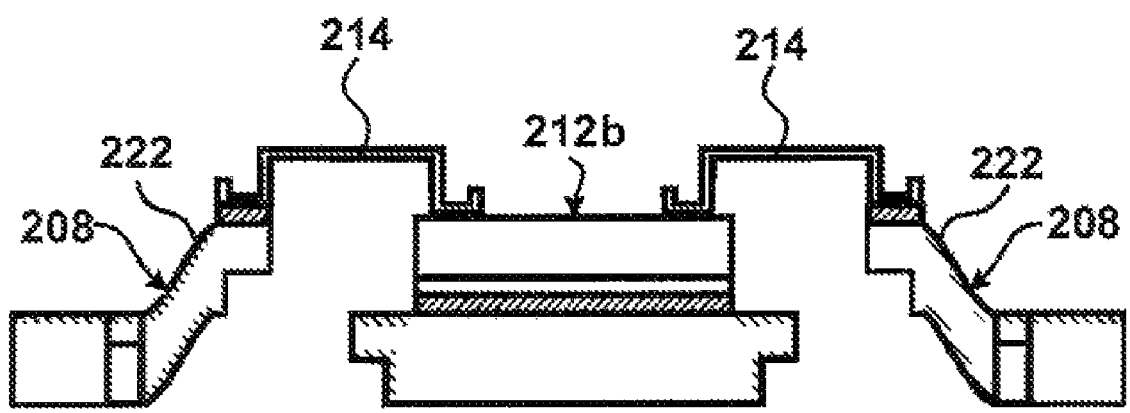

FIG. 2I shows the next step, wherein the appropriate bonding structures 214 are attached between the surface of the die 212b and the electroplated material 222 of an appropriate pin 208. As discussed above the bond structure may be a conducting clip, wire, or ribbon.

Figure 2J:
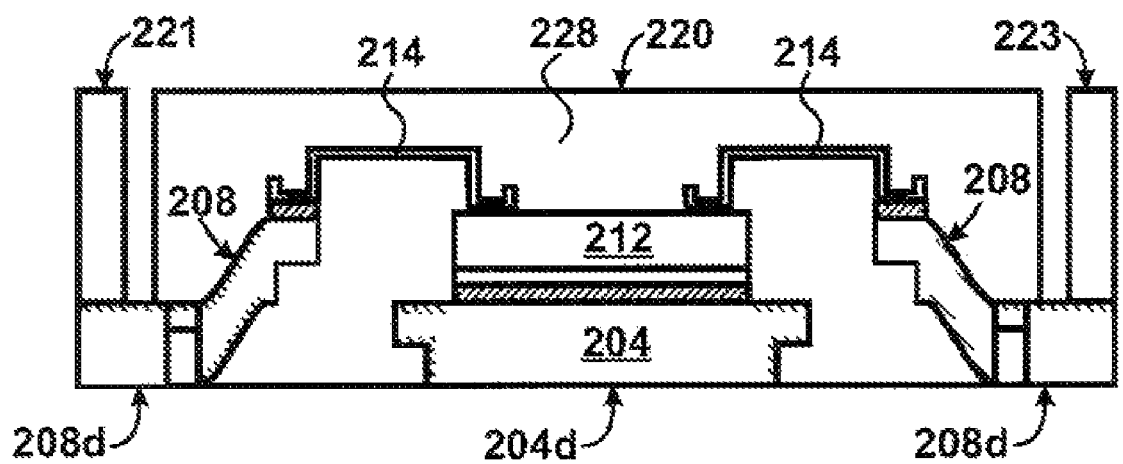

FIG. 2J shows a step in which the die 212, bonding structures 214, and portions of the pins 208 and diepad 204 are encapsulated within a plastic molding material 228 to form the body of the package 220. During this step, the diepad and pins remain fixed to the surrounding metal matrix of the original metal roll.

Figure 2K:
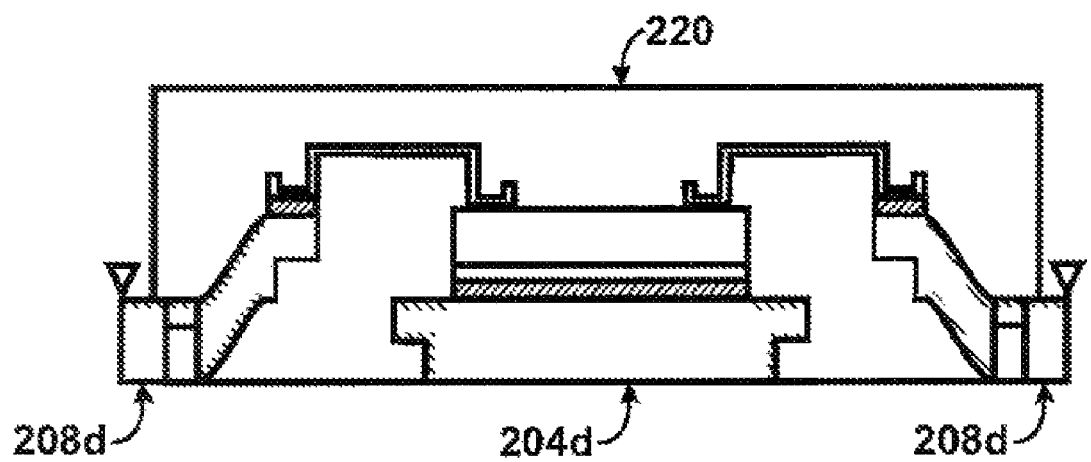
Figure 2C:
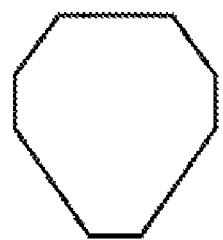
Figure 2C:
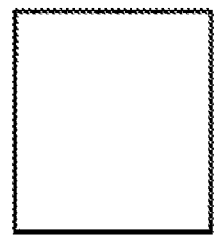
Figure 2C:
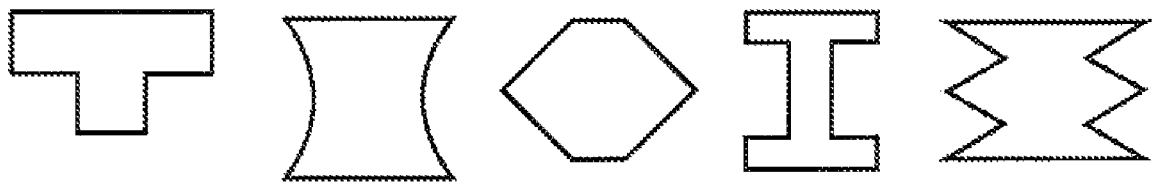

During the package singulation process shown in FIG. 2K, the pins 208 are exposed to significant physical strain as the punching blade moves through the metal. However, during this slicing process the angled edges offered by the chamfered cross-sectional profile of the pin shown in FIG. 2CA, serves to enhance mechanical interlocking of the pins within the plastic body material, and reduce physical strain at the interface between the pins and the package body.

The package singulation process in FIG. 2K leaves package 220 having exposed surface 208d of pin portions 208 and exposed surface 204d of diepad 204 stripped of brown oxide and ready for soldering to an underlying printed circuit (PC) board (not shown).

While the particular embodiment shown above depicts fabrication of a package housing a single die, the present invention is not limited to such a package. Alternative embodiments in accordance with the present invention could be used to form packages housing two, three, or even larger numbers of die.

Figure 3:
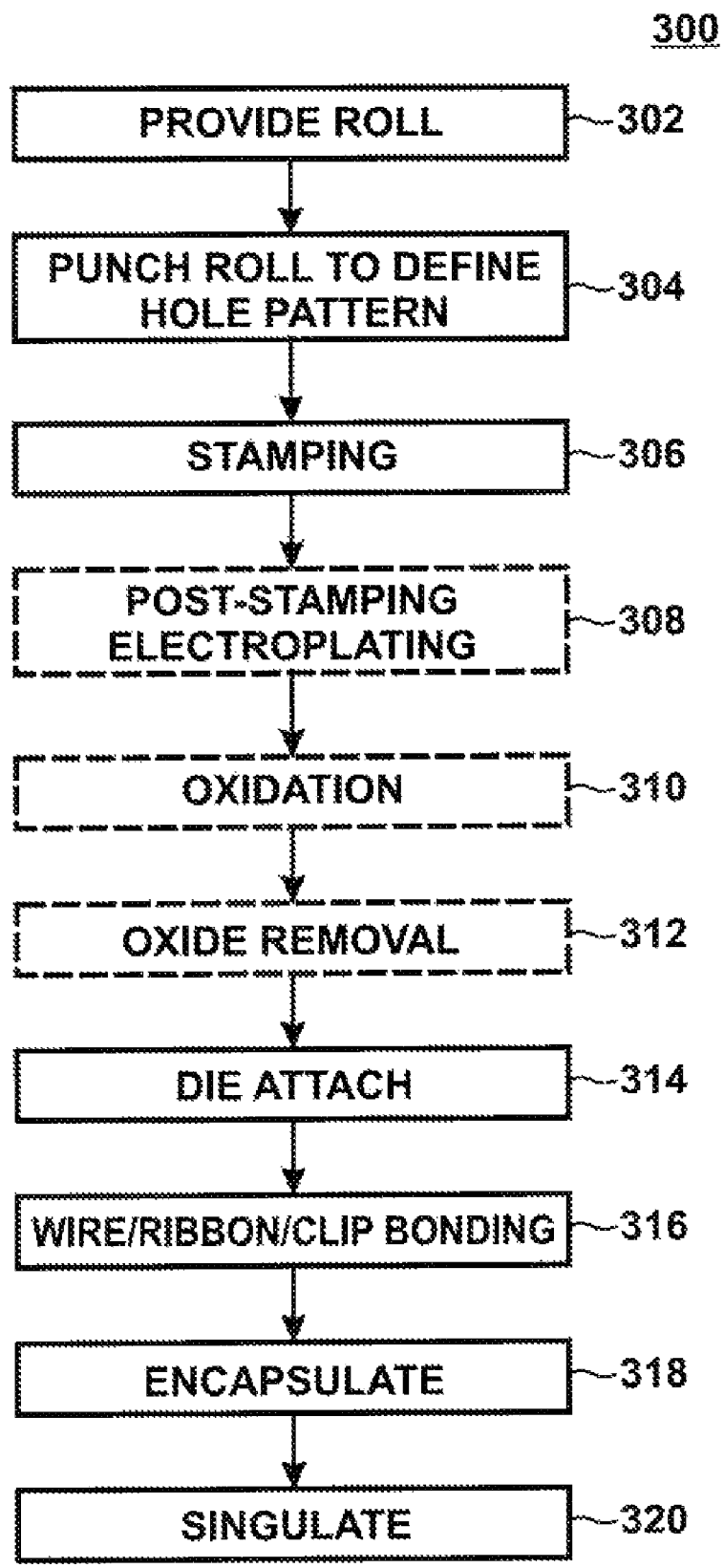
FIG. 3 shows a simplified view of the flow of a process according to an embodiment of the present invention.

FIG. 3 shows a simplified flow diagram of a process for fabricating a package according to an embodiment of the present invention. In a first step 302 of process 300, a continuous planar roll of conducting material is provided.

In a second step 304 of process 300, holes are punched completely through to remove material from the metal role and thereby define the pattern of the diepad and pins.

In a third step 306, the patterned metal roll is subjected to one or more stamping processes to create features on the pin and diepad portions of the package. As discussed in detail above, examples of such features include indentations on the underside of the diepad, pin portions exhibiting a chamfered cross-sectional profile, and raised pin portions.

In a fourth step 308, portions of the lead frame may optionally be electroplated with an appropriate metal. Examples of such electroplated regions include the die attach area, and the raised portions of the pins that are expected to receive an end of a bond structure such as a wire, ribbon, or clip having its other end in contact with the die.

In a fifth step 310, the stamped lead frame is exposed to an oxidizing ambient. A result of this exposure to the oxidizing ambient is the formation of brown oxide on all exposed portions of the lead frame surface. As discussed previously, this oxidation may desirably lead to the formation of an oxide guard band circumscribing the die attach area.

In a sixth step 312, brown oxide on the bottom surface of the pins and diepad may be removed. In certain embodiments, this oxide removal may be accomplished by physically lapping the bottom of the lead frame. In other embodiments, this oxide removal may be accomplished by exposure to a chemical etching environment.

The oxide removal step may occur immediately following the oxidation step, as indicated in FIG. 3. In other embodiments, however, the oxide removal step may occur later in the process, for example following the encapsulation step.

In a seventh step 314, the die is attached to the die attach area. In certain embodiments, this die attach step may include prior application of an electrically conducting adhesive material to the die attach area of the diepad. Alternative embodiments may utilize a die having its back side already coated with the electrically conducting adhesive material.

In an eighth step 316, the appropriate bonding structure(s) are attached between the surface of the die and the appropriate pin, which may be electroplated. As discussed above, the bond structure may be a conducting clip, wire, or ribbon. See, for example, FIG. 2I.

In a ninth step 318, the die, bond structure, and portions of the pins and diepad are encapsulated within a plastic molding material to form the body of the package. During this step, the diepad and pins remain fixed to the surrounding metal matrix of the original metal roll. See, for example, FIG. 2J.

In a tenth step 320, the individual package is singulated from the surrounding metal matrix by punching through the metal. During this singulation process, a chamfered or other complex cross-sectional profile imparted to the pins by stamping, may enhance mechanical interlocking of the pins within the package body, and allow the pins to relieve physical stress resulting from the shearing of the metal.

In additional steps (not shown), the package may be attached to an underlying PC board utilizing solder. The previous removal of brown oxide by lapping may facilitate the performance of this step.

The process described above represents only one particular embodiment of the present invention. Other embodiments may omit certain steps, include additional steps, or perform the steps in a specific order other than that indicated.

For example, the selective electroplating step is not required, and according to certain embodiments the bonding structure may be in contact with the bare metal of the roll rather than an electroplated feature. Moreover, the use of a bonding clip is not required by the present invention and certain embodiments could employ only bonding ribbons or wires to establish electrical connection with contact(s) on the top of the die.

Embodiments in accordance with the present invention offer a number of possible advantages over conventional package fabrication processes. In particular, by avoiding the need for complex and difficult-to-achieve steps of forming raised/recessed features on the lead frame by marking and partial etching, embodiments in accordance with the present invention offer cost savings.

Comparison of FIGS. 1B and 2B indicates that one characteristic that may not be offered by embodiments of the present invention, is a larger diepad area available to support a larger die. Specifically, features on the lead frame are formed by stamping that does not completely remove the material of the metal roll. Thus, in order to maintain the same lateral spacing B between the diepad and pins as in the etched package, embodiments of the present invention may utilize a diepad having slightly reduced dimensions (A' vs. A) in order to accommodate the stamped metal.

However, various other aspects of processes according to embodiments of the present invention may serve to offset any smaller size of the diepad and die. For example, the formation of the brown oxide guard band circumscribing the die attach area, effectively constrains the flow of the electrically conducting adhesive material during the die attach process. This in turn allows reduction in the peripheral area of the diepad that must be allocated to avoid the flowed material from undesirably affecting regions outside the die attach area.

Moreover, certain embodiments involve the use of clips instead of bond wires. Such use of a bond clip may allow for a reduced resistance electrical connection between the die contacts and the surrounding pins. This may in turn permit the use of a smaller die having performance comparable to a larger one.

Similarly, the use of selective electroplating may also offer a reduced resistance electrical connection between the die contacts and the surrounding pins. Again, this offers the possibility of a smaller die exhibiting performance comparable to a larger die.

The above figures present an exemplary embodiment only, and the present invention is not limited by this particular embodiment. For example, while the above figures show a diepad having indented features formed by stamping, this is not required by the present invention. According to other embodiments, a diepad could have raised features formed by stamping, such as raised features on a periphery of the diepad.

Moreover, while the specific embodiment shown above includes pin portions proximate to the diepad that are elevated by stamping, the present invention is not limited to this approach. In accordance with alternative embodiments, portions of the pins distal from the diepad could be inclined downward by stamping, thereby offering an embodiment wherein the bottom of the diepad is not exposed following encapsulation of the package body.

In addition, while the above figures describe an embodiment of a package configured to house a single die, this is not required by the present invention. Alternative embodiments of packages according to the present invention can be configured to house two or more die.

Figure 4A:
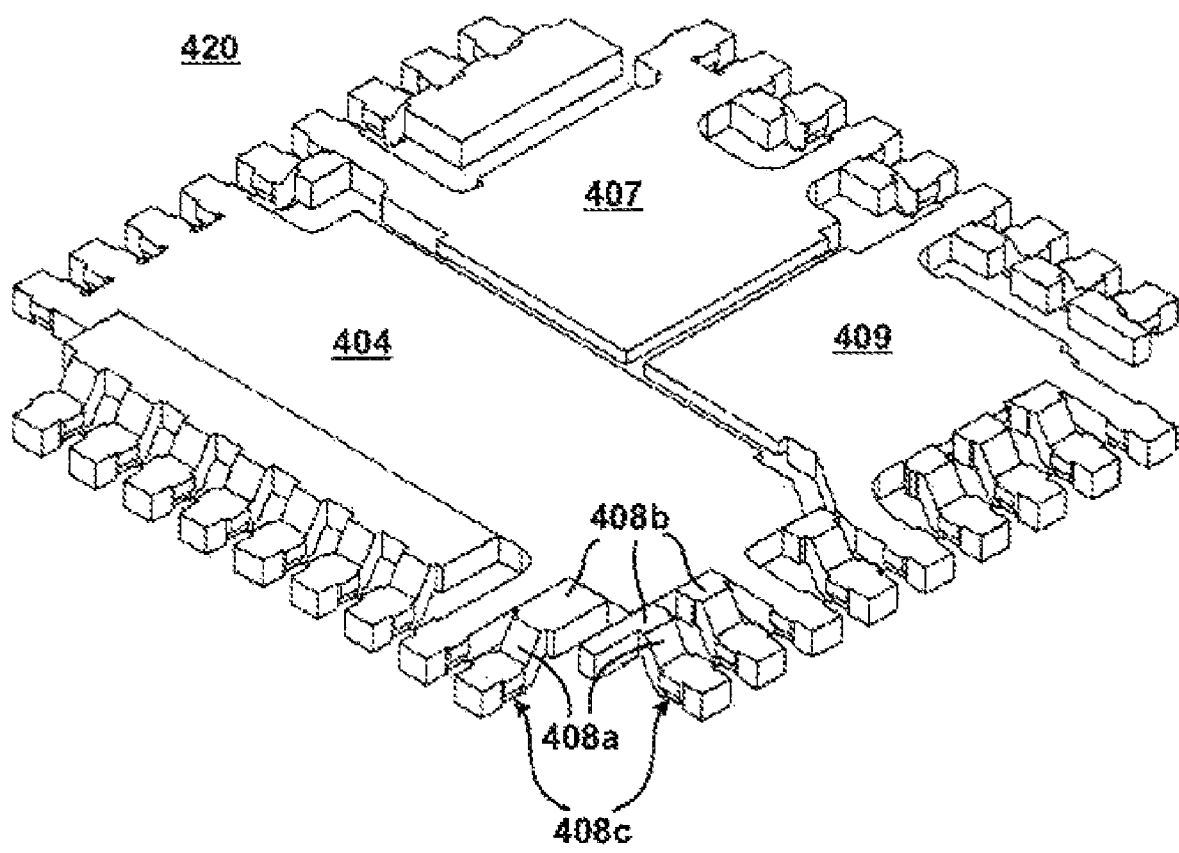
FIG. 4A shows a simplified perspective view of the lead frame of an embodiment of a package in accordance with the present invention housing three die.
Figure 4B:
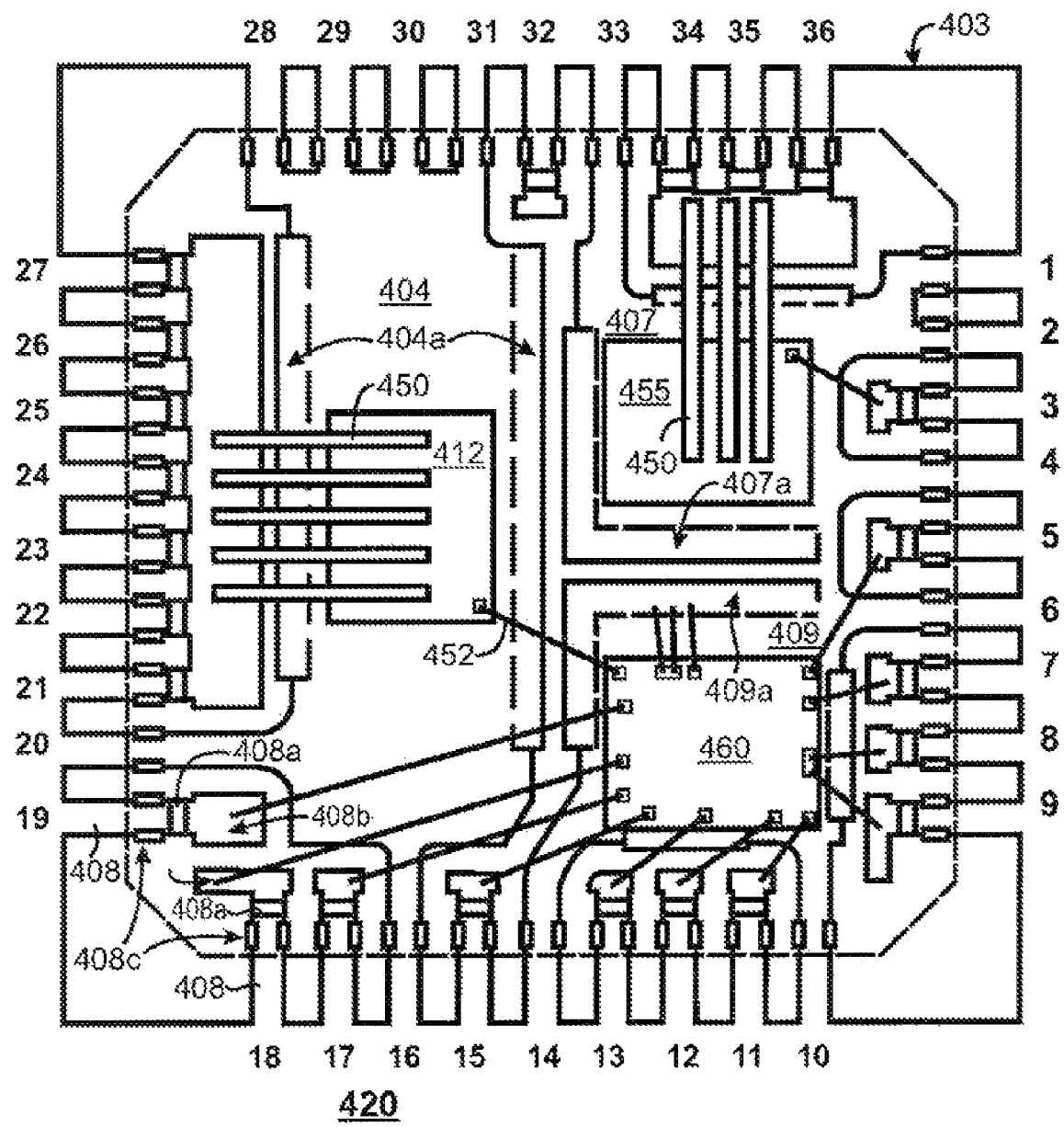
FIG. 4B is a simplified plan view showing the die and bond structures of the package of FIG. 4A.

For example, FIGS. 4A-B show different views of an embodiment of a quad flat no-lead (QFN) package housing three different die. Specifically, FIG. 4A shows a perspective view of the lead frame 403 only of the QFN package. FIG. 4B shows a plan view of the entire package 420 of FIG. 4A, including the die housed therein and the bonding structures attached thereto, with the outline of the plastic package body shown.

The lead frame 403 of the particular embodiment of FIGS. 4A-4B is formed from a copper roll having a thickness of between about 6-10 mils. The pins 408 have a width of about 0.25 mm or greater. The pitch between the pins is about 0.5 mm or greater.

Specifically, the stamped end frame 403 of package 420 comprises three diepads 404, 407, and 409, respectively supporting first MOSFET die 412, second MOSFET die 455, and integrated circuit (IC) die 460. Diepad 404 is the largest of the three, having an elongated die attach area 404a configured to support MOSFET die 412.

The pins of the package offer contact with three discrete portions of the first MOSFET die 412. Specifically, ganged pin nos. 21-27 are in low resistance communication with the source contact located on the top surface of the die 412, through clips 450. Pins 16, 20, and 28-31 are integral with the diepad 404, and hence offer a low resistance electrical communication with the drain of the MOSFET through a contact in the bottom surface of the die. The gate of the MOSFET is in electrical communication with a contact of the integrated circuit (IC) die 409 through bond wire 452.

Similarly, the pins of the package 420 offer contact with three discrete portions of the second MOSFET die 455. Specifically, ganged pin nos. 34-36 are in low resistance communication with the source contact located on the top surface of the die 455, through bonding clips 450. Pins 1-2, 4, and 33 are integral with the diepad 407, and hence offer a low resistance electrical communication with the drain of the MOSFET through a contact in the bottom surface of the die. The gate of the MOSFET is in electrical communication with pin 3 through bond wire 452.

Unlike the MOSFET die just described, the IC die 460 features a large number of contacts on its top surface. These various contacts are in electrical communication with the following pin nos.: 5, 7-9, 11-13, 15, and 17-18.

IC die 460 may or may not have an electrical contact in its lower surface. If it does, pins 6, 10, and 14 integral with the diepad 409 provide for low electrical resistance communication with that underside contact.

The multi-die embodiment of the QFN package 420 of FIGS. 4A-4B includes the stamped features of the single die package. Specifically, the diepads include indentations 404a, 407a, and 409a respectively as shown in dashed lines. These indentations are formed by stamping, and help to provide mechanical interlocking of the diepads with the encapsulant of the plastic mold material.

Another feature of the multi-die embodiment of the QFN package 420 of FIGS. 4A-4B is the chamfered cross-sectional profile 408c of portions of the pins 408 lying just inside the plastic package body. As described above, these chamfered cross-sectional profile serves to enhance mechanical interlocking with the surrounding molding of the package body, and increase the amount of surface area of the pin in contact with the plastic molding. In addition, the angled orientation of the sides of the pins serves to reduce stress within the package during punching at the time of singulation.

Yet another feature of the multi-die embodiment of the QFN package 420 of FIGS. 4A-4B is the raising of portions of the pins above the horizontal plane of the diepad. Specifically, during fabrication portions of the pins are bent by stamping to impart them with an inclined portion 408a and a corresponding raised portion 408b proximate to the diepads. As previously indicated, such a profile helps to ensure that the pins remain securely embedded within the plastic molding of the package. The raised pin profile also serves to ease strain in the bonding structure, by placing the surface of the pin at the height of the top surface of the die expected to be supported by the diepad.

As previously indicated, the multi-die embodiment of the QFN package 420 includes an IC die which may or may not have an electrical contact on its back side. Such an IC die would not be expected to generate as much heat as other dies such as MOSFETs. Accordingly, an epoxy die attach film may be used to adhere the IC die to the diepad. Such an epoxy film may be formed as a solid, and would not be expected to flow or spread during the die attach step. Accordingly, for embodiments of the present invention where a package is fabricated housing only an IC die, formation of a brown oxide guard band followed by lapping, may not be necessary.

While the embodiments described above illustrate the use of stamping to impart a chamfered cross-sectional profile to pin portions, this particular cross-sectional profile is not required by embodiments of the present invention. According to alternative embodiments, stamping could imbue pins with other cross-sectional profiles and remain with the scope of the invention. Examples of such other cross-sectional profiles include but are not limited to hourglass shaped, angled or curved concave, angled or curved convex, or saw tooth.

During conventional package fabrication processes, the diepad may be secured to the surrounding metal of the roll utilizing tie-bar structures. These conventional tie-bar structures stabilize the diepad during die attach, and encapsulation steps, and are then severed during the package singulation.

One advantage of embodiments in accordance with the present invention, is the dispensing of the need for a tie-bar structure. Specifically, the embodiment of FIGS. 4A-B does not include tie-bars or severed portions thereof. In particular, prior to the singulation step, each diepad is connected to a surrounding metal frame by way of at least two non-integral pins that would be integral with surrounding portions of the metal matrix. These integral pin portions function in the role of a tie-bar, physically stabilizing the diepad and insuring the physical integrity of the lead frame prior to the singulation step.

The absence of tie-bars offer a number of advantages. One advantage is having more area in the corners of a package to place more pins. Another advantage is that there is no exposed part of tie bars on a surface of a package.

Figure 5:
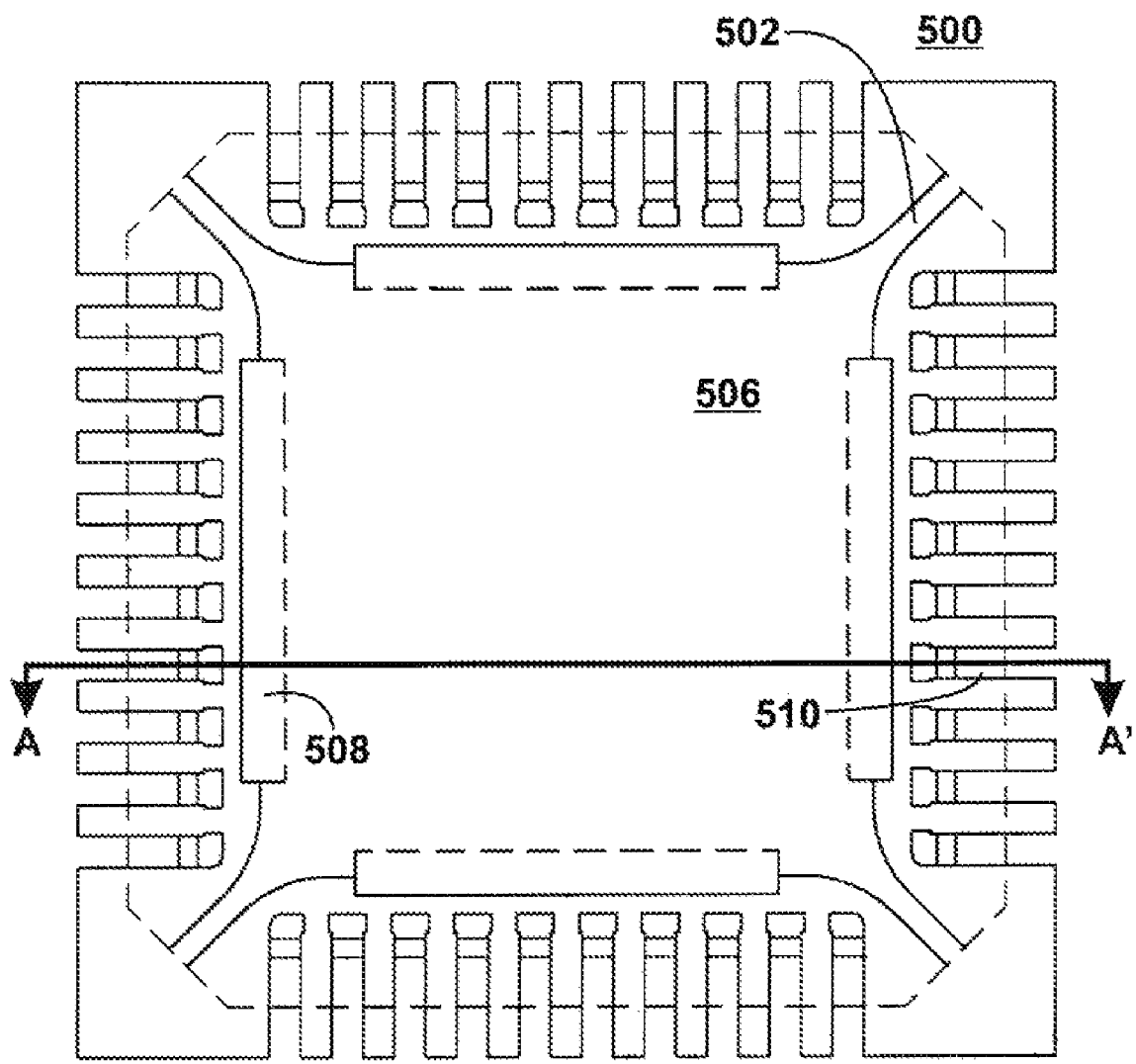
FIG. 5 is a simplified plan view showing a lead frame according to another embodiment of the present invention.

While the embodiment of FIG. 4B shows a lead frame lacking tie-bars and including ganged groups of non-integral pins for communicating with non-IC die, this is not required by the present invention. FIG. 5 is a simplified plan view showing a lead frame according to another embodiment of the present invention, and FIG. 5A is a simplified cross-sectional view taken along the line A-A' of FIG. 5.

Figure 5A:
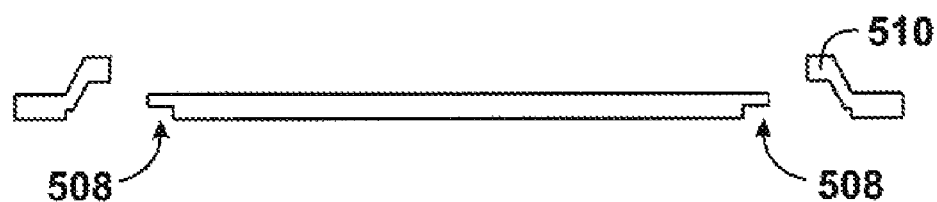
FIG. 5A is a simplified cross-sectional view taken along the line A-A' of FIG. 5.

The embodiment of FIGS. 5-5A shows a lead frame 500 having tie-bars 502 integral at the corners of the diepad 506. Coined indents 508 located on the underside of the diepad 506 are configured to interlock with plastic molding of the package upon encapsulation.

Figure 5B:
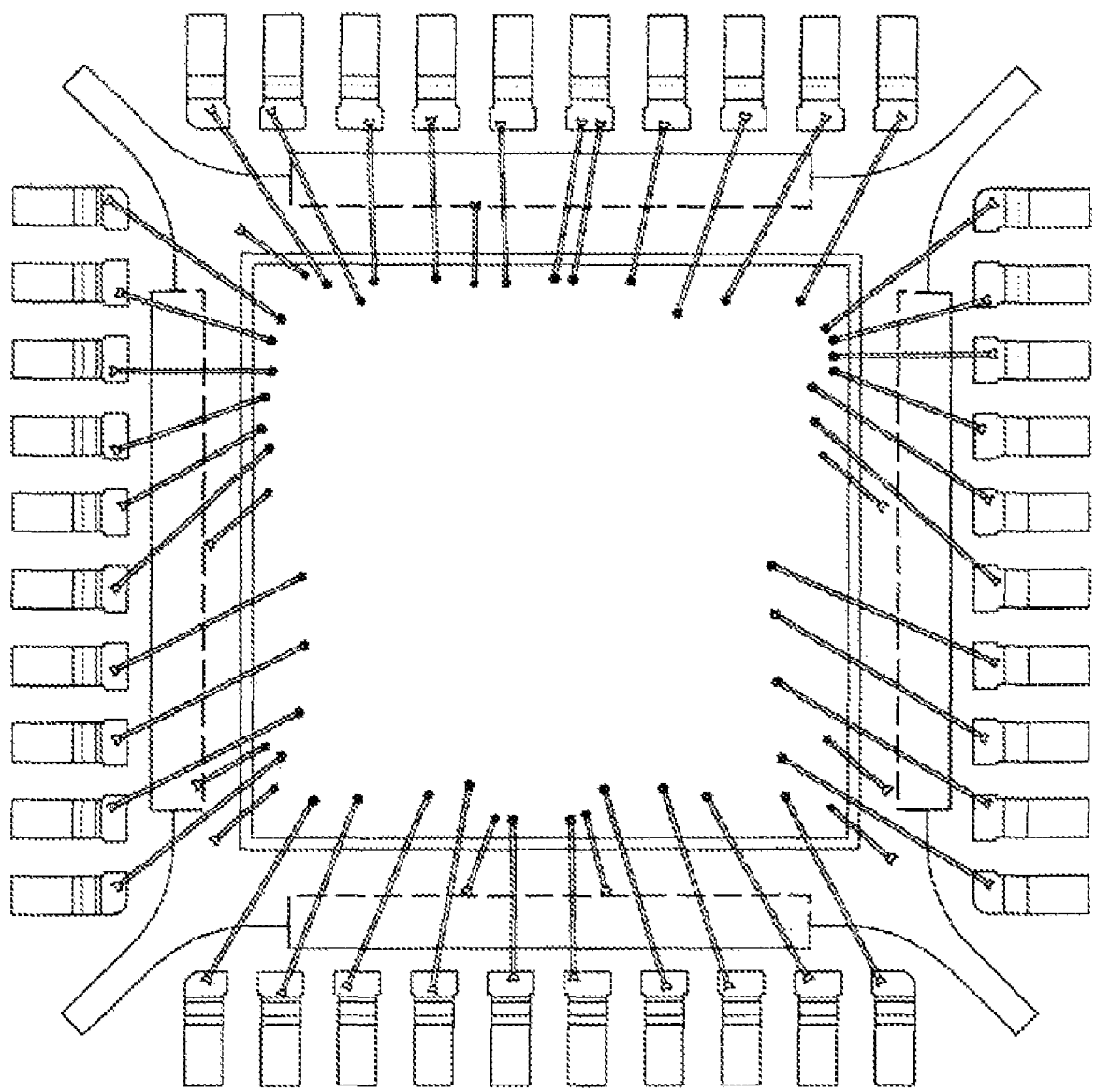
FIG. 5B is a simplified plan view showing positioning of a die and bond wires on the lead frame of FIG. 5.

FIG. 5B is a simplified plan view showing positioning of a die and bond wires on the lead frame of FIG. 5. As shown in FIG. 5B, the large number of exclusively single individual pins 510 of this embodiment, are suitable for communicating through bond wires with the plurality of contacts present on a top surface of a complex IC die such as a microprocessor, that is supported on the diepad.

Figure 6:
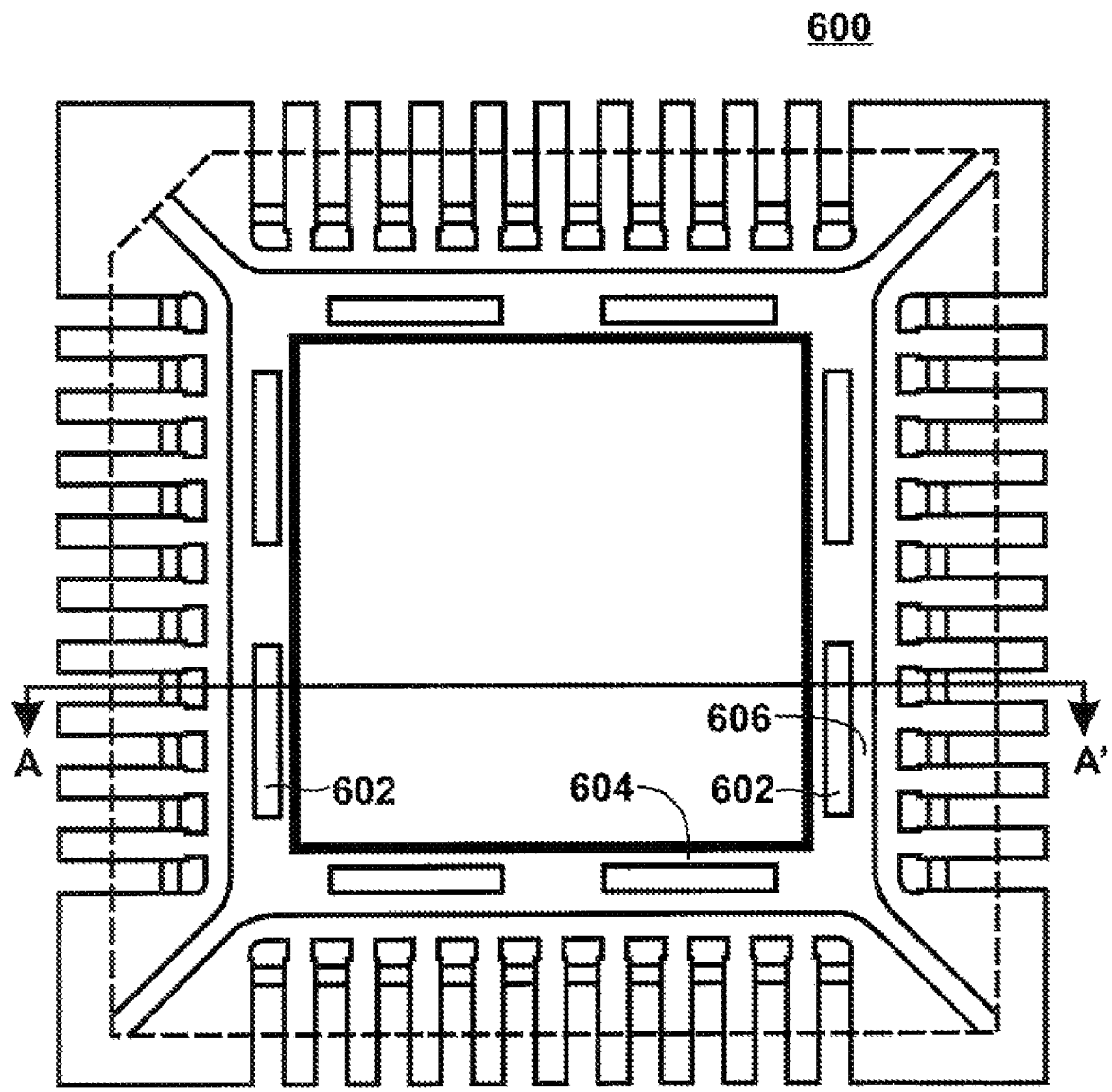
FIG. 6 is a simplified plan view showing a lead frame according to yet another embodiment of the present invention.
Figure 6A:
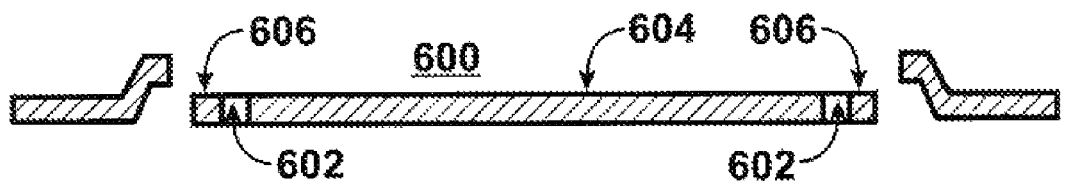
FIG. 6A is a simplified cross-sectional view taken along the line A-A' of FIG. 6.

Types of features other than those explicitly described above, can be formed on a lead frame by coining according to alternative embodiments of the present invention. For example, FIG. 6 is a simplified plan view showing a lead frame according to yet another embodiment of the present invention, supporting a die. FIG. 6A is a simplified cross-sectional view taken along the line A-A' of FIG. 6, absent the die.

The embodiment of FIGS. 6-6A shows a lead frame 600 which includes a number of holes 602 formed by stamping or coining, in the periphery of the diepad region 604. The holes 602 allow penetration of plastic molding during the encapsulation step, thereby providing additional mechanical interlocking of the lead frame.

In addition, the holes 602 serve to isolate and preserve rim/runway area 606 (from the die to the edge of the die-pad) for down bonding. In particular the presence of the holes serves to contain unwanted bleeding or overflow of die attach material during the die attach step. For example, in one embodiment where the diepad has an overall width of 5.1 mm, the hole may have a width of 0.2 mm, and may be separated from the diepad edge by a distance of 0.2 mm forming the down bond runway.

Lead frames according to embodiments of the present invention may combine multiple features that are formed by coining. For example, the lead frame shown in FIGS. 6A-B features both the coined holes, and pins having elevated portions and cross-sectional profiles formed by coining.

Figure 7A:
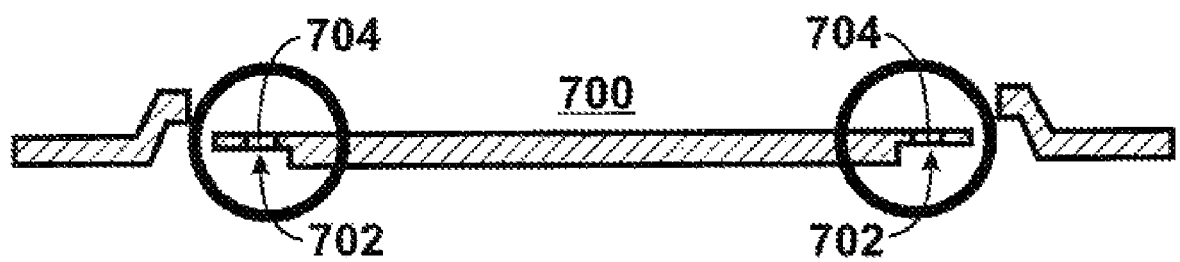
FIG. 7A is a simplified cross-sectional view of another embodiment of a lead frame of the present invention.
Figure 7B:
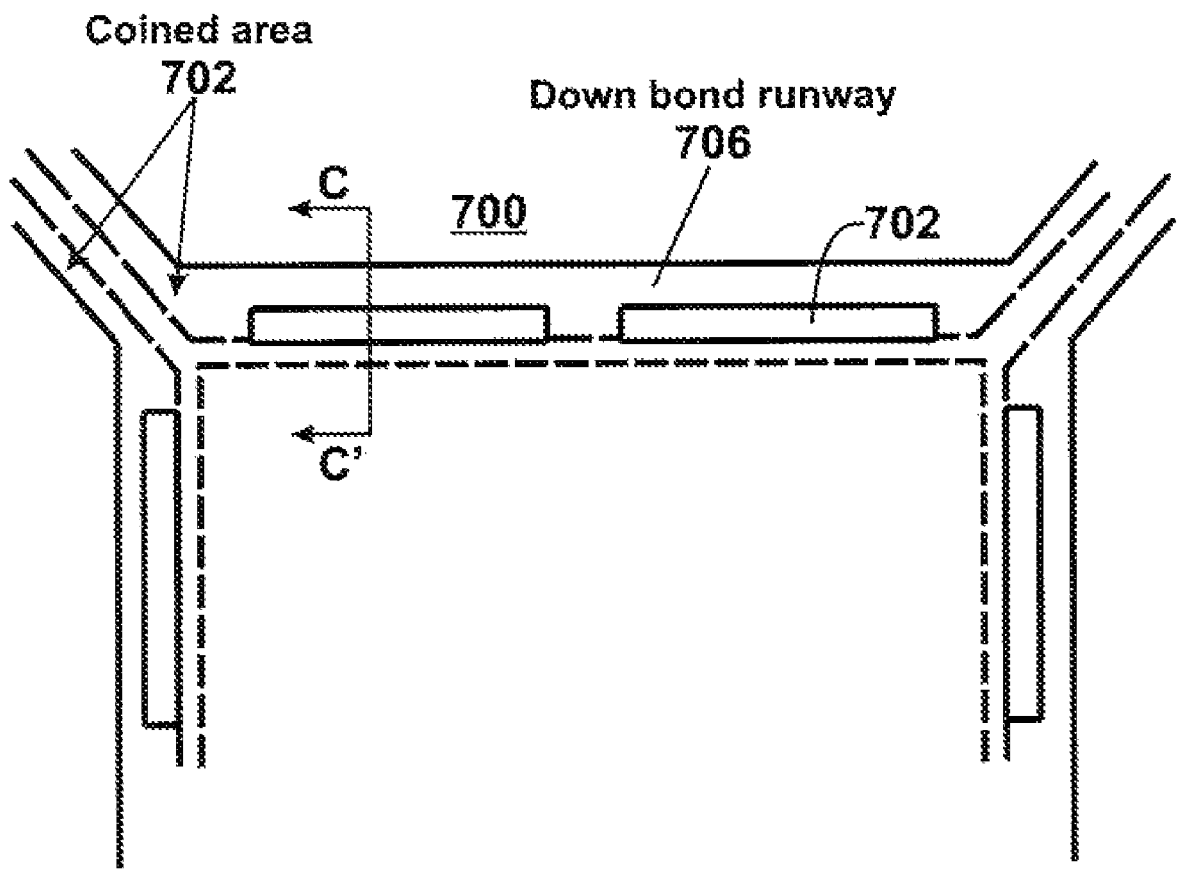
FIG. 7B shows an enlarged plan view of a portion of the lead frame of FIG. 7A.
Figure 7C:
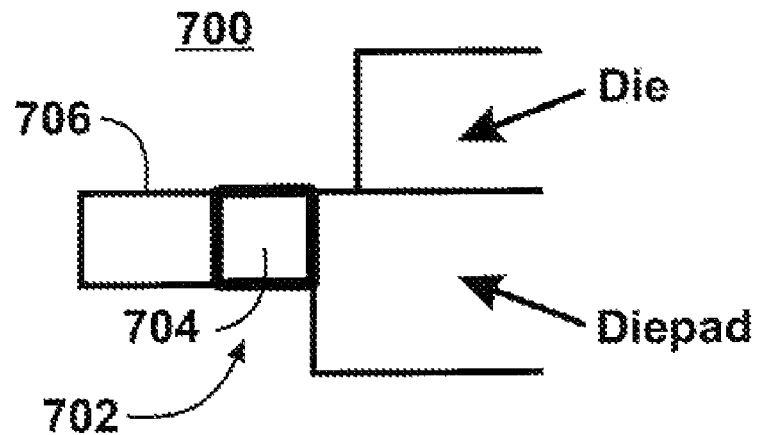
FIG. 7C shows an enlarged cross-sectional view of the lead frame of FIG. 7B taken along line C-C'.

As a further example of a lead frame having multiple coined features, FIG. 7A is a simplified cross-sectional view of another embodiment of a lead frame of the present invention. FIG. 7B shows an enlarged plan view of a portion of the lead frame of FIG. 7A including a supported die. FIG. 7C shows an enlarged cross-sectional view of the lead frame of FIG. 7B taken along line C-C', including a supported die.

Specifically, the lead frame 700 of the embodiments of FIGS. 7A-C includes both a coined indent 702 on the underside of the periphery of the diepad, and a plurality of holes 704 formed by coining in the periphery of the diepad region. The location of holes 704 define a down bond runway region 706 that is configured to receive a down bond wire from the supported die, and which is shielded from overflow of die attach material by the holes.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A process of fabricating a package for a semiconductor device, the method comprising:
    providing a metal layer;
    punching a pattern of holes through the metal layer to define a diepad and a plurality of pins;
    stamping a portion of the metal layer to:
        elevate a portion of a pin above a horizontal plane of the diepad, and
        impart a pin with a complex cross-sectional profile that is other than square or rectangular; and
    encapsulating at least a portion of the elevated portion of the pin and complex cross-sectional profile within a package body.

2. The process of claim 1 further comprising wherein the stamping forms an indent on a portion of the diepad or on a portion of a pin.

3. The process of claim 1 wherein the complex cross-sectional profile mechanically interlocks the pin within the package body.

4. The process of claim 1 wherein the complex cross-sectional profile is selected from chamfered, hourglass-shaped, T-shaped, I-shaped, concave, convex, or saw toothed.

5. The process of claim 1 wherein the stamping creates a hole proximate to a periphery of the diepad.

6. The process of claim 5 wherein a down bond runway region is defined between the hole and an edge of the diepad.

7. The process of claim 1 wherein the punching creates the plurality of pins exhibiting a width of 0.15 mm or greater.

8. The process of claim 1 wherein the punching creates the plurality of pins having a pitch of 0.4 mm or greater.

9. The process of claim 1 wherein providing the metal layer comprises providing a copper roll.

10. The process of claim 9 wherein providing the copper roll comprises providing a copper roll having a thickness of between about 0.004-0.020".

11. The process of claim 1 further comprising electroplating a portion of the pins.

12. The process of claim 11 further comprising electroplating a die attach portion of the diepad.

13. The process of claim 12 further comprising oxidizing the electroplated diepad to form a guard band around the die attach portion.

14. The process of claim 1 further comprising attaching a die to the diepad with an electrically conducting adhesive material.

15. The process of claim 14 wherein the electrically conducting adhesive material is pre-coated on a backside of the die.

16. The process of claim 14 wherein the electrically conducting adhesive material is coated on the diepad prior to attachment of the die.

17. The process of claim 14 wherein a spreading of the electrically conducting adhesive material is contained by an oxide guard band.

18. The process of claim 14 further comprising providing an electrically conducting clip between a contact on the die and a pin.

19. The process of claim 1 wherein the punching creates at least two pins integral with the diepad and with orthogonal portions of the surrounding metal roll.

* * * * *